(12) United States Patent
Hsieh

(10) Patent No.: US 11,150,705 B1
(45) Date of Patent: Oct. 19, 2021

(54) RISER ASSEMBLY AND ELECTRONIC DEVICE

(71) Applicants: Inventec (Pudong) Technology Corporation, Shanghai (CN); INVENTEC CORPORATION, Taipei (TW)

(72) Inventor: Han-Chih Hsieh, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/021,026

(22) Filed: Sep. 15, 2020

(30) Foreign Application Priority Data

Jun. 5, 2020 (CN) .......................... 202010507191.6

(51) Int. Cl.
 *G06F 1/18* (2006.01)
 *H05K 7/14* (2006.01)
(52) U.S. Cl.
 CPC .............. *G06F 1/185* (2013.01); *G06F 1/184* (2013.01); *H05K 7/1488* (2013.01)

(58) Field of Classification Search
 CPC ...................................................... G06F 1/187
 See application file for complete search history.

(56) References Cited

U.S. PATENT DOCUMENTS

| 7,430,115 B2 * | 9/2008 | Liu | G06F 1/187 |
| | | | 312/223.2 |
| 2011/0173805 A1 * | 7/2011 | Richet | G11B 33/123 |
| | | | 29/825 |

* cited by examiner

*Primary Examiner* — Jerry Wu
(74) *Attorney, Agent, or Firm* — Locke Lord LLP; Tim Tingkang Xia, Esq.

(57) ABSTRACT

A riser assembly and an electronic device. Riser assembly configured to install expansion card on chassis and electrically connected to motherboard. The riser assembly includes first mounting frame and riser card. First mounting frame is configured to be mounted on chassis. Riser card includes plate body, riser card connector and expansion card connector. Plate body includes first surface and second surface that face away from each other. Riser card connector is disposed on first surface of plate body and protrudes from plate body. Expansion card connector is disposed on second surface of plate body and protrudes from plate body. Plate body is fixed to first mounting frame. Riser card connector is configured to be electrically connected to motherboard via cable, and expansion card connector is configured to be electrically connected to expansion card.

6 Claims, 7 Drawing Sheets

RISER ASSEMBLY AND ELECTRONIC DEVICE

CROSS-REFERENCE TO RELATED APPLICATIONS

This non-provisional application claims priority under 35 U.S.C. § 119(a) on Patent Application No(s). 202010507191.6 filed in China, on Jun. 5, 2020, the entire contents of which are hereby incorporated by reference.

BACKGROUND OF THE INVENTION

Technical Field of the Invention

The invention relates to a riser assembly and an electronic device, more particularly to a riser assembly and an electronic device that include a riser card.

Description of the Related Art

In general, there are various electronic components disposed on a motherboard. When the space for accommodating the motherboard is limited, some of the electronic components, such as expansion cards, can be installed on a riser card plugged on the motherboard so as to be arranged parallel to the motherboard. A typical riser card has metal pins to be plugged into the connector on the motherboard.

However, the metal pins and connectors on the motherboard limit the arrangement of the riser card on the motherboard. That is, the riser card only can be disposed around the motherboard so as to allow the riser card to be directly plugged into the connector on the motherboard. If the riser card is disposed in other redundant space in the server that is located away from the motherboard, it is unable to be plugged into the connector on the motherboard. Therefore, the limited space in the server is unable to be effectively utilized.

SUMMARY OF THE INVENTION

The invention is to provide a riser assembly and an electronic device to provide a flexible way to install the riser card on the motherboard and therefore enable a flexible and effective utilization of the internal space.

One embodiment of this invention provides a riser assembly configured to install an expansion card on a chassis and configured to be electrically connected to a motherboard. The riser assembly includes a first mounting frame and a riser card. The first mounting frame is configured to be mounted on the chassis. The riser card includes a plate body, a riser card connector and an expansion card connector. The plate body includes a first surface and a second surface that face away from each other. The riser card connector is disposed on the first surface of the plate body and protrudes from the plate body. The expansion card connector is disposed on the second surface of the plate body and protrudes from the plate body. The plate body is fixed to the first mounting frame. The riser card connector is configured to be electrically connected to the motherboard via a cable, and the expansion card connector is configured to be electrically connected to the expansion card.

Another embodiment of this invention provides an electronic device including a chassis, a motherboard, a cage, an electronic component, a riser assembly and an expansion card. The motherboard is disposed on the chassis. The cage is disposed on the chassis so that the cage and the chassis form an accommodation space therebetween. The electronic component is accommodated in the accommodation space. The riser assembly includes a first mounting frame and a riser card. The first mounting frame is mounted on the chassis. The riser card includes a plate body, a riser card connector and an expansion card connector. The riser card connector protrudes from the plate body along a thickness direction of the plate body. The expansion card connector is disposed on the plate body. The plate body is fixed to the first mounting frame. The riser card connector is electrically connected to the motherboard via a cable. The expansion card is electrically connected to the expansion card connector.

According to the electronic device and the riser assembly disclosed by the above embodiments, the riser card is electrically connected to the motherboard via the cable, instead of being directly plugged on the motherboard, and thus the riser card is not limited to be disposed on the motherboard in a perpendicular manner. This provides a flexible arrangement of the riser card on the motherboard and allows the riser card to be placed in idle internal space of the electronic device, thereby improving the utilization of the internal space.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
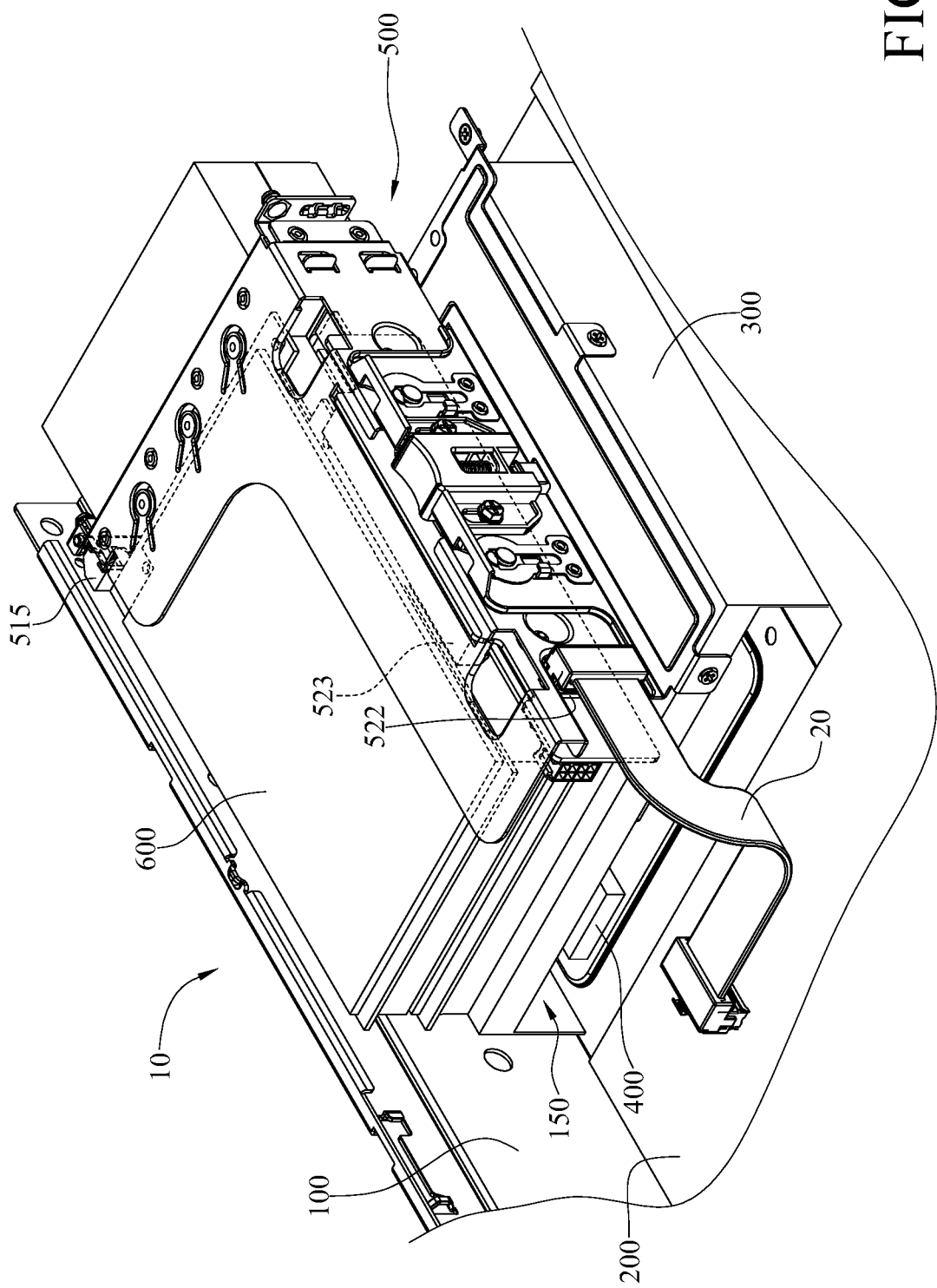
FIG. 1 is a partially enlarged perspective view of an electronic device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
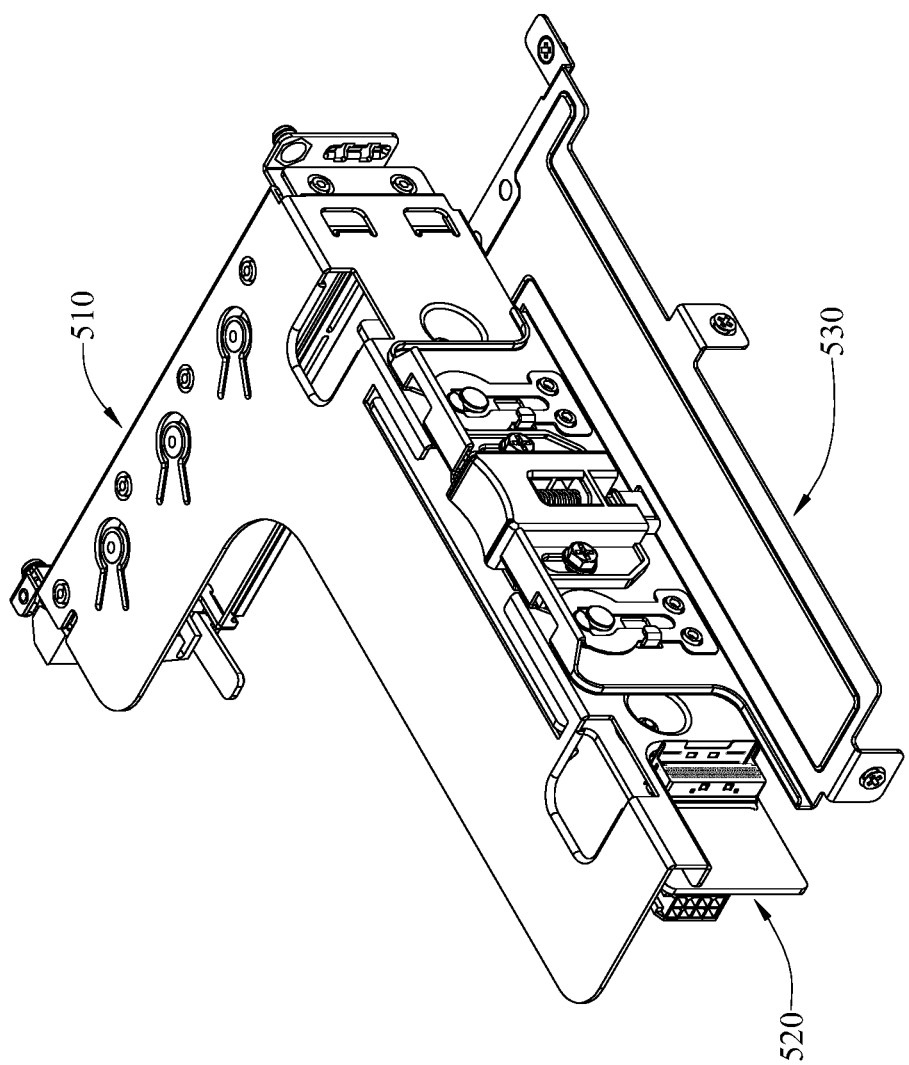
FIG. 2 is a perspective view of a riser assembly of the electronic device in FIG. 1.
Figure 3:
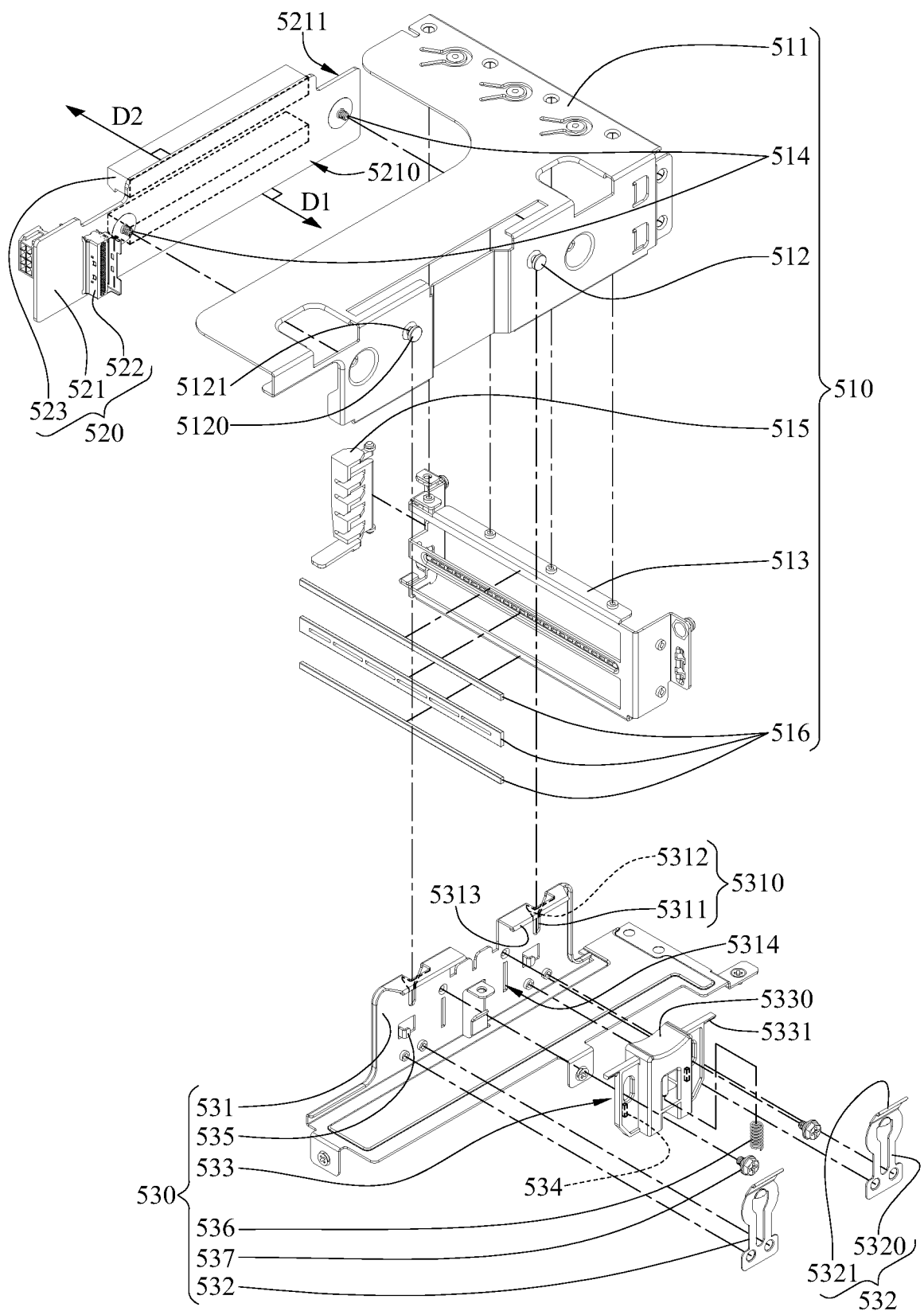
FIG. 3 is an exploded view of the riser assembly in FIG. 2.
Figure 4:
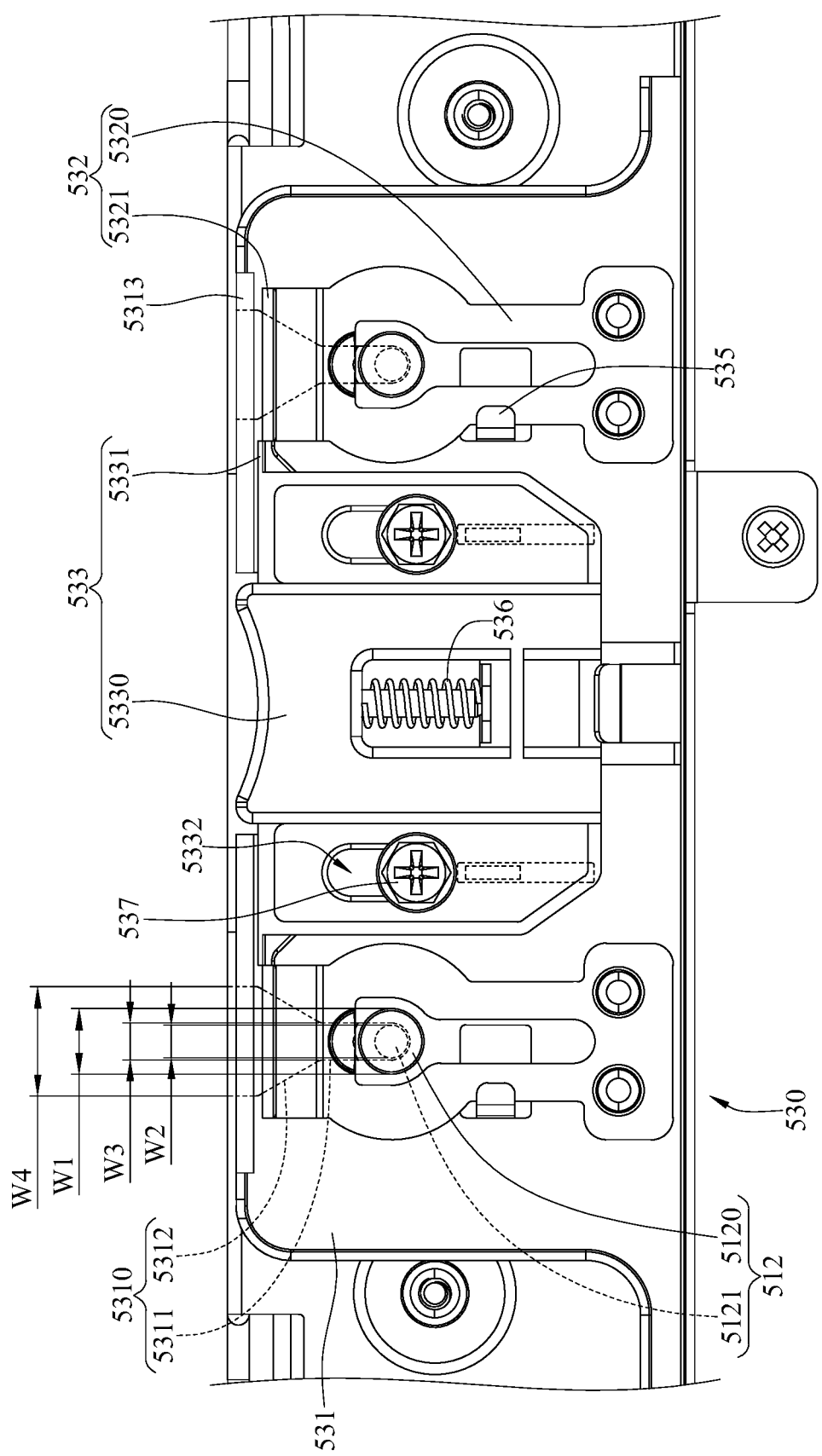
FIG. 4 is a front view showing that an elastic part of a clip is blocked by a blocking structure of a fixed base.

Please refer to FIG. 1 to FIG. 4, where FIG. 1 is a partially enlarged perspective view of an electronic device 10 according to an embodiment of the invention, FIG. 2 is a perspective view of a riser assembly 500 of the electronic device 10 in FIG. 1, FIG. 3 is an exploded view of the riser assembly 500 in FIG. 2, and FIG. 4 is a front view showing that an elastic part 5321 of a clip 532 is blocked by a blocking structure 5313 of a fixed base 531.

In this embodiment, the electronic device 10 is, for example, a server and includes a chassis 100, a motherboard 200, a cage 300, an electronic component 400, the riser assembly 500, and two expansion cards 600.

The motherboard 200 is disposed in the chassis 100. The cage 300 is disposed in the chassis 100, and the cage 300 and the chassis 100 together form an accommodation space 150 therebetween. The electronic component 400 is accommodated in the accommodation space 150 and is, for example, a power supply.

In this embodiment, the riser assembly 500 includes a first mounting frame 510, a riser card 520, and a second mounting frame 530. In this embodiment, the first mounting frame 510 is disposed on the second mounting frame 530, and the second mounting frame 530 is disposed on the cage 300; in other words, the first mounting frame 510 is mounted on the chassis 100 via the second mounting frame 530 and the cage 300. The riser card 520 is fixed to the first mounting frame 510, and the expansion cards 600 are disposed on the riser card 520 and held in position by the first mounting frame 510.

In this embodiment, the first mounting frame 510 includes a main frame body 511, two positioning pillars 512, a front frame body 513, two fasteners 514, a latch 515, and a plurality of shielding components 516.

Please refer to FIG. 3 and FIG. 4, the positioning pillars 512 protrude from the main frame body 511. Each positioning pillar 512 includes a head part 5120 and a neck part 5121, and a diameter W1 of the head part 5120 is greater than a diameter W2 of the neck part 5121. The head part 5120 is connected to the main frame body 511 via the neck part 5121; specifically, the neck part 5121 is fixed to the main frame body 511, and the head part 5120 is connected to a side of the neck part 5121 that is located away from the main frame body 511.

The front frame body 513 is fixed to the main frame body 511. The two fasteners 514 are, for example, screws that can be screwed into the main frame body 511 and the riser card 520. The riser card 520 is fixed to the main frame body 511 of the first mounting frame 510 using the two fasteners 514.

As shown in FIG. 1 and FIG. 2, the latch 515 is fixed to the front frame body 513, and the latch 515 can help position the expansion cards 600. The shielding components 516 are disposed on the front frame body 513 and configured to prevent the electromagnetic field from affecting the operation of the expansion cards 600 or the riser card 520.

In this embodiment, the riser card 520 includes a plate body 521, a riser card connector 522, and two expansion card connectors 523. The plate body 521 includes a first surface 5210 and a second surface 5211 that face away from each other. In this embodiment, the riser card connector 522 is disposed on the first surface 5210 of the plate body 521 and protrudes from the first surface 5210 of the plate body 521 along a thickness direction D1 of the plate body 521. In addition, the expansion card connectors 523 are disposed on the second surface 5211 of the plate body 521 and protrude from the second surface 5211 of the plate body 521 along a direction D2 opposite to the thickness direction D1. Furthermore, in this embodiment, the riser card connector 522 protrudes from a side of the plate body 521 that is located close to the second mounting frame 530. The plate body 521 is fixed to the main frame body 511 of the first mounting frame 510 using the fasteners 514. The riser card connector 522 is, for example, a connector that can be electrically connected to the motherboard 200 via a cable 20. As shown in FIG. 1, the expansion cards 600 are plugged into the expansion card connectors 523, respectively.

Note that the location of the riser card connector 522 on the plate body 521 is not intended to limit the invention. In other embodiments, the riser card connector may be arranged on another side of the plate body that is located away from the second mounting frame.

In this embodiment, the second mounting frame 530 includes the fixed base 531, two positioning holes 5310, two clips 532, a handle 533, two stoppers 535, and an elastic component 536.

Please refer to FIG. 3 and FIG. 4, the positioning holes 5310 is located on the fixed base 531. Each positioning hole 5310 includes a narrower portion 5311 and a wider portion 5312 connected to each other. The wider portion 5312 tapers towards the narrower portion 5311. As shown, the diameter W1 of the head part 5120 of the positioning pillar 512 is greater than the width W3 of the narrower portion 5311 and is smaller than the maximum width W4 of the wider portion 5312, and the diameter W2 of the neck part 5121 of the positioning pillar 512 is smaller than the width W3 of the narrower portion 5311. In such an arrangement, the neck part 5121 of the positioning pillar 512 is allowed to be disposed through the narrower portion 5311 of the positioning hole 5310 and the head part 5120 of the positioning pillar 512 can rest on the fixed base 531, and therefore the positioning pillar 512 is able to fix the main frame body 511 of the first mounting frame 510 and the fixed base 531 of the second mounting frame 530 to each other. In other words, the first mounting frame 510 can be positioned on the second mounting frame 530 by positioning the positioning pillar 512 in the positioning hole 5310.

The clips 532 each include a fixed part 5320 and the elastic part 5321 that are connected to each other. The fixed part 5320 is fixed on the fixed base 531. The fixed base 531 further includes two blocking structures 5313. The two blocking structures 5313 protrude from a side of the fixed base 531 that is located away from the main frame body 511 of the first mounting frame 510. The blocking structures 5313 are located on sides of the elastic parts 5321 that are located away from the fixed parts 5320, respectively. The neck part 5121 of the positioning pillar 512 is held in the narrower portion 5311 of the positioning hole 5310 by the elastic part 5321 so that the neck part 5121 is prevented from unexpectedly coming off from the narrower portion 5311.

The handle 533 includes a press part 5330, two pushing parts 5331, and two sliders 534. The press part 5330 is slidably disposed on the fixed base 531 and therefore includes a released position and a pressed position. In detail, the fixed base 531 further includes two slots 5314, and the sliders 534 are, for example, integrally formed with the press part 5330 and are disposed in the slots 5314, respectively. The pushing parts 5331 protrude from two opposite sides of the press part 5330, respectively.

In this embodiment, the second mounting frame 530 further includes two fasteners 537, and the press part 5330 of the handle 533 includes two slots 5332. The fasteners 537 are, for example, screws that can be screwed into the fixed base 531 of the second mounting frame 530. Also, the fasteners 537 are slidably disposed in the slots 5332, respectively.

Note that the sliders 534 and the slots 5314 are exemplary for the press part 5330 to be slidably disposed on the fixed base 31 and are not intended to limit the invention. In other embodiments, the press part can be slidably disposed on the fixed base via the cooperation of one or more gears and gear racks.

The stoppers 535 are, for example, integrally formed with the fixed base 531 and protrude from the fixed base 531. The stoppers 535 are located on sides of the elastic parts 5321 of the clips 532, respectively.

Two opposite ends of the elastic component 536 are fixed to the press part 5330 and the fixed base 531, respectively, and the elastic component 536 is, for example, a compression spring.

The operation of the handle 533 will be described hereinafter. Please refer to FIG. 4 to FIG. 7, where FIG. 5 is a side cross-sectional view showing that the elastic part 5321 of the clip 532 is blocked by the blocking structure 5313 of the fixed base 531, FIG. 6 is a front view showing that the elastic part 5321 of the clip 532 is moved away from the blocking structure 5313 of the fixed base 531, and FIG. 7 is a side cross-sectional view showing that the elastic part 5321 of the clip 532 is moved away from the blocking structure 5313 of the fixed base 531.

Figure 5:
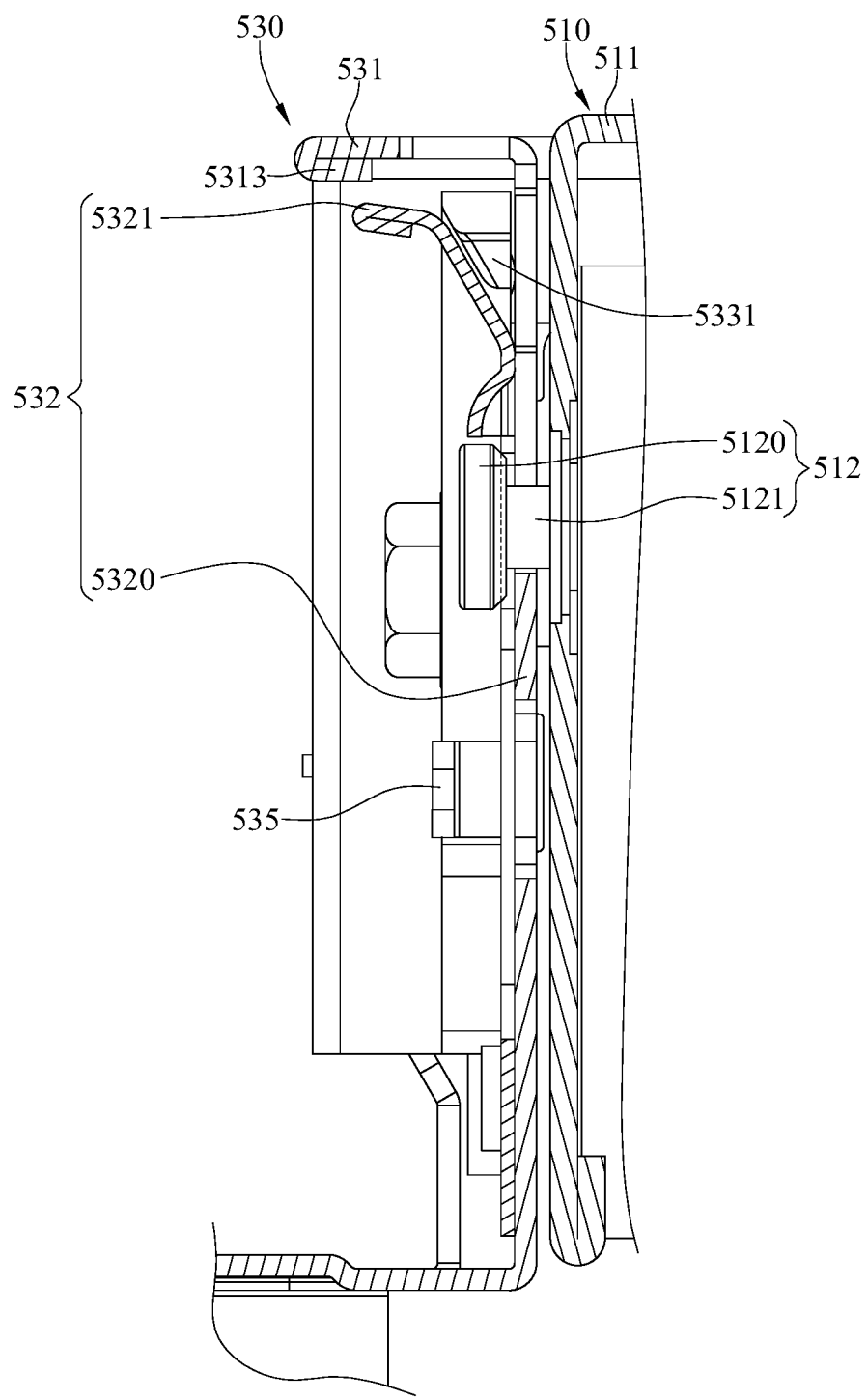
FIG. 5 is a side cross-sectional view showing that the elastic part of the clip is blocked by the blocking structure of the fixed base.

As shown in FIG. 4 and FIG. 5, when the press part 5330 of the handle 533 is in the released position, the pushing part 5331 of the handle 533 is located on a side of the elastic part 5321 of the clip 532 so that the blocking structure 5313 is located on a side of the elastic part 5321 that is located away from the fixed part 5320, and the neck part 5121 of the positioning pillar 512 is held in position by the elastic part 5321. At this moment, the neck part 5121 is prevented from unexpectedly coming off from the narrower portion 5311 of the positioning hole 5310. Also, since the blocking structure 5313 is located on the side of the elastic part 5321 that is located away from the fixed part 5320, the blocking structure 5313 is able to prevent people from unintentionally touching the elastic part 5321 to affect the holding to the neck part 5121 of the positioning pillar 512. In addition, as shown in FIG. 4, the slider 534 is located on a side of the slot 5314 of the fixed base 531 and the fastener 537 is located on a side of the slot 5332 of the press part 5330.

Figure 6:
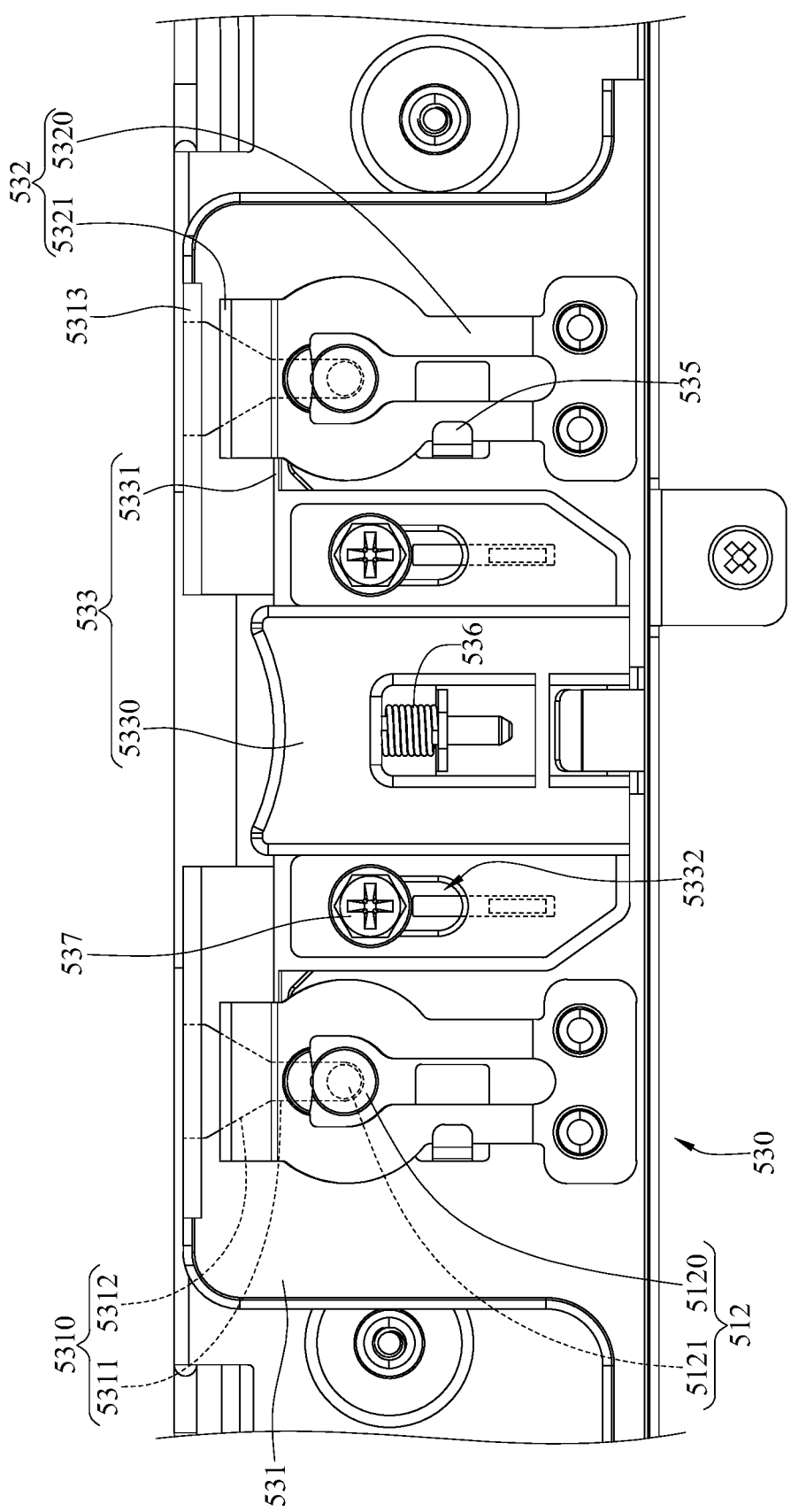
FIG. 6 is a front view showing that the elastic part of the clip is moved away from the blocking structure of the fixed base.
Figure 7:
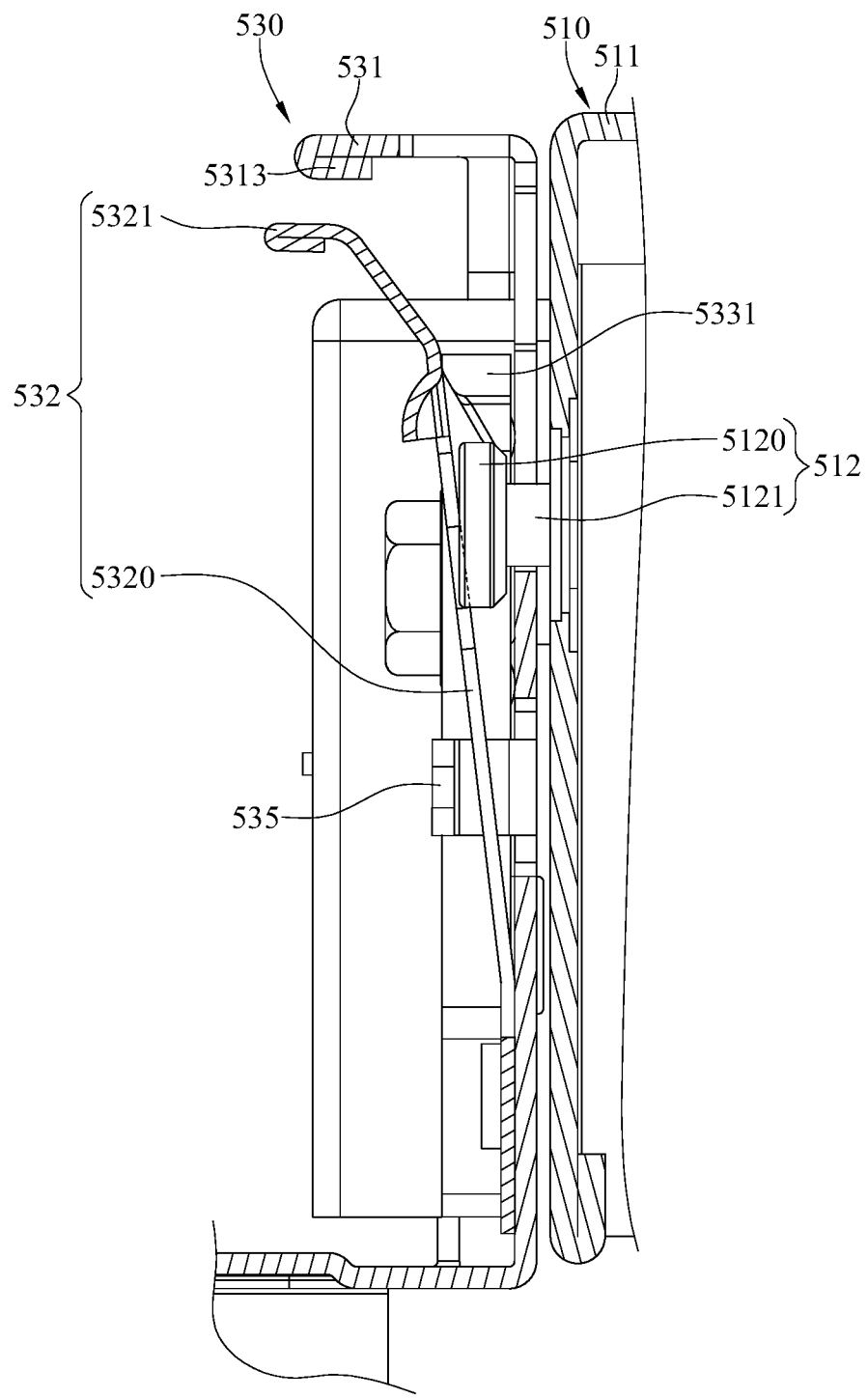
FIG. 7 is a side cross-sectional view showing that the elastic part of the clip is moved away from the blocking structure of the fixed base.

As shown in FIG. 6 and FIG. 7, when the press part 5330 of the handle 533 is moved to the pressed position, the pushing part 5331 of the handle 533 pushes the elastic part 5321 of the clip 532 so that the blocking structure 5313 of the fixed base 531 is allowed to be moved away from the elastic part 5321, at this moment, the neck part 5121 of the positioning pillar 512 is not restricted by the elastic part 5321. As such, the neck part 5121 is allowed to be moved to the wider portion 5312 of the positioning hole 5310 from the narrower portion 5311 of the positioning hole 5310 so that the fixed base 531 of the second mounting frame 530 is allowed to be removed from the main frame body 511 of the first mounting frame 510 (i.e., the second mounting frame 530 is allowed to be detached from the first mounting frame 510). Moreover, as shown in FIG. 7, when the press part 5330 of the handle 533 is in the pressed position, the stopper 535 is located on a side of the elastic part 5321 of the clip 532 so as to restrict the movement of the elastic part 5321. Furthermore, as shown in FIG. 6, when the press part 5330 of the handle 533 is in the pressed position, the elastic component 536 is compressed. When the compressed elastic component 536 is released, it can move the press part 5330 back to the released position. In addition, as shown in FIG. 6, the slider 534 is located on another side of the slot 5314 of the fixed base 531 and the fastener 537 is located on another side of the slot 5332 of the press part 5330.

The elastic component 536 is optional. In other embodiments, the second mounting frame may not include the elastic component 536 and the press part may be moved between the pressed position and the released position in a manual manner Moreover, the stoppers 535 are optional. In other embodiments, the second mounting frame may not include the stoppers 535 and the movement of the elastic parts of the clips may be restricted in a manual manner.

Furthermore, the second mounting frame 530 is optional, and that is to say that the first mounting frame 510 is not limited to be fixed to the cage 300 via the second mounting frame 530. In other embodiment, the riser assembly may not include the second mounting frame 530, and the first mounting frame may be directly fixed to the cage.

According to the electronic device and the riser assembly disclosed by the above embodiments, the riser card is electrically connected to the motherboard via the cable, instead of being directly plugged on the motherboard, and thus the riser card is not limited to be disposed on the motherboard in a perpendicular manner. This provides a flexible arrangement of the riser card on the motherboard and allows the riser card to be placed in idle internal space of the electronic device, thereby improving the utilization of the internal space.

In some embodiments of the invention, the electronic device may be served as a server particularly for artificial intelligence (AI) computation, edge computation, or be served as a 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A riser assembly, configured to install an expansion card on a chassis and configured to be electrically connected to a motherboard, the riser assembly comprising:
   a first mounting frame, configured to be mounted on the chassis;
   a riser card, comprising a plate body, a riser card connector and an expansion card connector, the plate body comprising a first surface and a second surface that face away from each other, the riser card connector disposed on the first surface of the plate body and protruding from the plate body, the expansion card connector disposed on the second surface of the plate body and protruding from the plate body, the plate body fixed to the first mounting frame, the riser card connector configured to be electrically connected to the motherboard via a cable, and the expansion card connector configured to be electrically connected to the expansion card; and
   a second mounting frame, wherein the first mounting frame comprises a main frame body and a positioning pillar, the positioning pillar protrudes from the main frame body, the second mounting frame comprises a fixed base and a positioning hole, the positioning hole is located on the fixed base, the fixed base is fixed to the chassis, and the first mounting frame is positioned on the second mounting frame by positioning the positioning pillar in the positioning hole; the second mounting frame further comprises a clip, the clip comprises a fixed part and an elastic part that are connected to each other, the fixed part is fixed to the fixed base, and the positioning pillar is held in position by the elastic part.

2. The riser assembly according to claim 1, wherein the second mounting frame further comprises a handle, the handle comprises a press part and a pushing part, the press part is slidably disposed on the fixed base so as to comprise a released position and a pressed position, the pushing part protrudes from a side of the press part, when the press part is in the released position, the pushing part is located on a side of the elastic part of the clip so that the positioning pillar is held in position by the elastic part, and when the press part is in the pressed position, the pushing part presses the elastic part of the clip so that the positioning pillar is moved away from the elastic part.

3. The riser assembly according to claim 2, wherein the handle of the second mounting frame further comprises a slider, the fixed base further comprises a slot, and the handle is slidably disposed in the slot of the fixed base via the slider.

4. The riser assembly according to claim 2, wherein the second mounting frame further comprises an elastic component, two opposite ends of the elastic component are respectively fixed to the press part and the fixed base so as to move the press part from the pressed position back to the released position.

5. The riser assembly according to claim 2, wherein the second mounting frame further comprises a stopper, the stopper protrudes from the fixed base, and when the press part is in the pressed position, the stopper is located on a side of the elastic part of the clip.

6. An electronic device, comprising:
  a chassis;
  a motherboard, disposed on the chassis;
  a cage, disposed on the chassis so that the cage and the chassis form an accommodation space therebetween;
  an electronic component, accommodated in the accommodation space;
  a riser assembly, comprising:
    a first mounting frame, mounted on the chassis;
    a riser card, comprising a plate body, a riser card connector and an expansion card connector, the riser card connector protruding from the plate body along a thickness direction of the plate body, the expansion card connector disposed on the plate body, the plate body fixed to the first mounting frame, the riser card connector electrically connected to the motherboard via a cable; and
    a second mounting frame, wherein the first mounting frame comprises a main frame body and a positioning pillar, the positioning pillar protrudes from the main frame body, the second mounting frame comprises a fixed base and a positioning hole, the positioning hole is located on the fixed base, the fixed base is fixed to the chassis, and the first mounting frame is positioned on the second mounting frame by positioning the positioning pillar in the positioning hole; and the second mounting frame further comprises a clip, the clip comprises a fixed part and an elastic part that are connected to each other, the fixed part is fixed to the fixed base, and the positioning pillar is held in position by the elastic part;
  and an expansion card, electrically connected to the expansion card connector.

\* \* \* \* \*